United States Patent [19]

Nonogaki et al.

[11] Patent Number: 5,443,659
[45] Date of Patent: Aug. 22, 1995

[54] FLUX FOR SOLDERING AND SOLDER COMPOSITION COMPRISING THE SAME AND SOLDERING METHOD USING THE SAME

[75] Inventors: Mitsuhiro Nonogaki; Junji Fujino; Akira Adachi; Kohei Murakami; Yoshiyuki Morihiro; Osamu Hayashi, all of Amagasaki, Japan

[73] Assignee: Mitsubishi Denki Kabushiki Kaisha, Tokyo, Japan

[21] Appl. No.: 335,348

[22] Filed: Nov. 3, 1994

[30] Foreign Application Priority Data

Dec. 24, 1993 [JP] Japan .................................. 5-327771

[51] Int. Cl.$^6$ ............................................. B23K 35/34
[52] U.S. Cl. .......................................... 148/23; 148/24; 148/25
[58] Field of Search .................................... 148/23–26

[56] References Cited

U.S. PATENT DOCUMENTS

| | | | |
|---|---|---|---|
| 3,175,933 | 3/1965 | Wasserman ............................ | 148/26 |
| 3,840,411 | 10/1974 | Rozzi et al. ............................ | 148/23 |
| 4,187,348 | 2/1980 | Dearlove et al. ..................... | 428/418 |
| 4,460,414 | 7/1984 | Hwang ................................. | 148/26 |

FOREIGN PATENT DOCUMENTS

| | | |
|---|---|---|
| 63-45702 | 2/1988 | Japan . |
| 5-53080 | 8/1993 | Japan . |
| 1093153 | 11/1967 | United Kingdom . |
| 1119435 | 7/1968 | United Kingdom . |
| 1172626 | 12/1969 | United Kingdom . |

OTHER PUBLICATIONS

M. Kitajima et al., "Clean Soldering with No Residue Flux", *Proceedings of the 7th International Microelectronics Conference*, Jun. 3–5, 1992, pp. 187–193.

N. Bandyopadhyay et al., "Development of Fluxless Soldering Process for Surface Mount Technology", *Soldering and Surface Mount Technology*, No. 4, Feb. 1990, pp. 23–26.

*Primary Examiner*—Peter D. Rosenberg
*Attorney, Agent, or Firm*—Burns, Doane, Swecker & Mathis

[57] ABSTRACT

Flux for soldering comprising inorganic ion-exchanger and activator containing halogen atom, solder composition the flux and solder particles, soldering method comprising coating the solder composition on a portion for soldering, soldering method comprising coating flux containing activator on a portion for soldering, applying inorganic ion-exchanger to the portion and applying solder to the portion, and soldering method comprising mixing inorganic ion-exchanger with creamy solder to give mixture, coating the mixture on a circuit pattern of a wiring plate and heating the wiring plate. The flux for soldering and the soldering composition are excellent in metal ion-migration resistance, corrosion resistance, soldering property and storage stability, and can be preferably used without cleaning and the soldering methods can be preferably used in practical no-clean soldering methods.

19 Claims, 1 Drawing Sheet

FLUX FOR SOLDERING AND SOLDER COMPOSITION COMPRISING THE SAME AND SOLDERING METHOD USING THE SAME

BACKGROUND OF THE INVENTION

The present invention relates to a flux for soldering and a solder composition comprising the same and a soldering method using the same, and more particularly to a flux for soldering which does not necessitate cleaning after soldering electronic parts on a substrate and a solder composition comprising the flux for soldering and a soldering method using the solder composition.

Conventionally, after electronic parts are soldered on a substrate, the substrate should be cleaned up with a solvent containing Flon 113 (CFC-113) as a main component in order to mainly remove a flux. However, the use of a specific Flon represented by Flon 113 is undesirable for reasons of environment problems in recent years. Therefore, it is urgently required to develop a method for cleaning a substrate with a cleaning agent other than Flon after soldering or a soldering method in which a step of cleaning is omitted.

Among the above-mentioned methods, as reported in "MITSUBISHI DENKI GIHO" Vol 67, No. 6, p. 532–536 (1993), is a soldering method in which a step of cleaning is omitted, since ionic components such as a halogen ion of a halogenous activator, which is used for removing a layer of oxide, are contained in a flux or a creamy solder used for soldering and remain after soldering. Accordingly, when the electronic parts-soldered printed wiring board is used for a long period of time, the remaining ionic components accelerate the generation of ion-migration of an electrically conductive metal and thereby there is a danger for occurrence of poor insulation in a wiring of the substrate. Moreover, since corrosion of a wired metal is apt to occur, danger of breakage or snapping of the electrical conductive metal is incurred. From the reasons as mentioned above, when soldering is carried out by using a halogenous activator having an excellent soldering property without cleaning after soldering, danger for occurrence of electrical failure caused by a remaining halogen ion on the substrate is increased. Accordingly, as a material for soldering which does not necessitate cleaning after soldering, there are proposed a flux and a creamy solder in which the halogenous activator is not used or the amount of a halogen atom is reduced. Also, as a soldering method which does not necessitate cleaning after soldering, there are proposed a soldering method using the above-mentioned flux or the above-mentioned creamy solder. When the flux or the creamy solder is used, or the above soldering method is employed, electrical reliability (hereinafter also referred to as metal ion-migration resistance) is insured.

As a flux not containing a halogenous activator, for instance, there is proposed a flux generally referred to as a low-solid flux in which an organic acid such as an aliphatic carboxylic acid not containing halogen components is used as an activator and the total amount of remaining solid matter of flux, that is, flux components other than solvent is decreased as described in Japanese Unexamined Patent Publication No. 262893/1992.

Also, for instance, as described in Japanese Unexamined Patent Publication No. 86390/1991, there is proposed a creamy solder in which a halogenous activator is not used or the amount of a halogen atom in the activator is decreased by using a sulfonic acid salt as an activator.

Furthermore, for instance, as described in Japanese Unexamined Patent Publication No. 269896/1992, there is proposed a soldering method in which a flux is not used or a flux showing low activity such as a low-solid flux is used, and soldering is carried out in an atmosphere of inert gas such as nitrogen gas.

However, when the above-mentioned low-solid flux in which an organic acid such as an aliphatic carboxylic acid not containing halogen components is used as an activator or the creamy solder in which an activator containing a halogen atom is not used or the amount of a halogen atom is decreased by using a sulfonic acid salt as an activator is used, as compared with the case when a flux in which a halogenous activator is used or a creamy solder in which a halogenous activator is used is employed, metal ion-migration resistance and corrosion resistance are improved. However, the ability for removing the layer of metal oxide is small since the halogenous activator is not used and the resin film is thin. Accordingly, there are some fatal defects that ability for restricting the oxidation of the surface of metal at high temperatures is lowered and soldering property becomes worse. Therefore, there are problems that soldering delinquency is easily generated and productivity becomes worse.

Also, according to the soldering method in which no flux or a flux showing low activity is used and soldering is carried out in an atmosphere of inert gas such as nitrogen gas, there is a fatal defect in that running costs become great, and there is a problem in that simplification of the steps for soldering and lowering of costs which are the merits of this method cannot be accomplished.

An object of the present invention is to provide a material for soldering showing: excellent electric reliability in comparison with a conventional soldering method which does not necessitate cleaning after soldering, and excellent soldering properties improved processability of soldering without cleaning after soldering, and a soldering method using the material for soldering.

This and the other objects of the present invention will become apparent from the description hereinafter.

SUMMARY OF THE INVENTION

The present invention has attempted in cosideration of the above-mentioned prior art.

In accordance with the present invention, there are provided a flux for soldering comprising an inorganic ion-exchanger and an activator containing a halogen atom, a solder composition comprising solder particles and a flux for soldering comprising an inorganic ion-exchanger and an activator containing a halogen atom, a soldering method which comprises a step of coating a solder composition comprising solder particles and a flux for soldering comprising an inorganic ion-exchanger and an activator containing a halogen atom on a portion for soldering of a substrate, a soldering method which comprises a step of coating a flux containing an activator on a portion for soldering, a step of applying an inorganic ion-exchanger to the portion for soldering and a step of applying a solder to the portion for soldering, and a soldering method which comprises a step of mixing an inorganic ion-exchanger with a creamy solder to give a mixture, a step of coating the mixture on a circuit pattern of a wiring plate and a step of heating the wiring plate.

DETAILED DESCRIPTION

Figure 1:
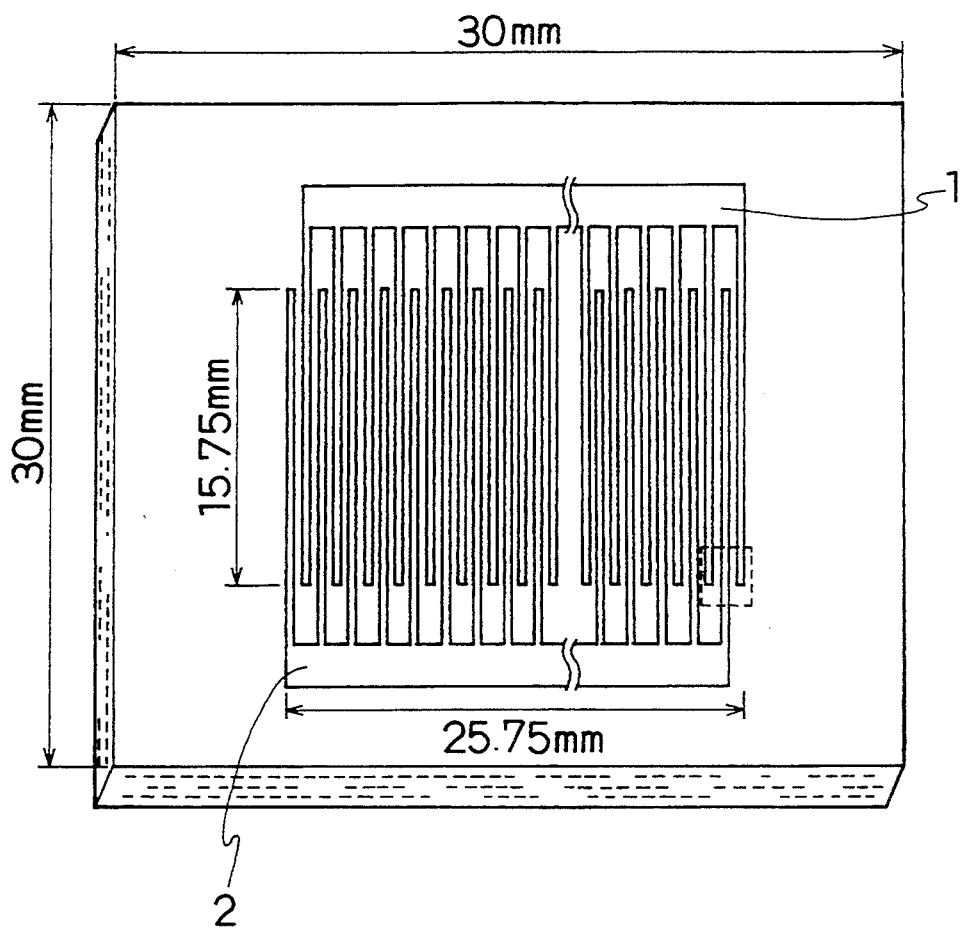
FIG. 1 is a schematic illustrative drawing showing a substrate for ion-migration test used in Examples of the present invention and Comparative Examples.

As mentioned above, the flux for soldering of the present invention contains an inorganic ion-exchanger and an activator containing a halogen atom.

The flux for soldering of the present invention contains the inorganic ion-exchanger which can capture ions such as a halogen ion and copper ion included in the activator, which are used for the removal of a layer of oxide. Therefore, the flux for soldering of the present invention prevents ion-migration of ions such as a halogen ion and therefore, soldering can be carried out with high processability and without any problem.

The above-mentioned inorganic ion-exchanger usually has a hydroxyl group showing high selective ionic adsorptivity. Therefore, the inorganic ion-exchanger can capture and fix an ionic impurity such as a halogen ion which promotes ionization.

Functions that the halogen ion is captured in the inorganic ion-exchanger are as follows.

Reaction of the inorganic ion-exchanger a having hydroxyl group represented by $R^+OH^{31}$ with an ionic impurity having a halogen ion represented by $H^+X^-$ (acid type) is as follows.

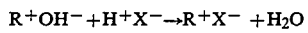

$$R^+OH^- + H^+X^- \rightarrow R^+X^- + H_2O$$

According to the reaction, water is generated.

It is an important characteristic of the inorganic ion-exchanger that the reversible reaction hardly occurs. Therefore, there is a large advantage in that captured ions such as a halogen ion are hardly released from the inorganic ion-exchanger.

As mentioned above, when the flux for soldering containing the inorganic ion-exchanger is used as an agent for capturing ions, since the halogen ion and copper ion which remain after soldering are captured by the inorganic ion-exchanger, corrosion of an electrically conductive metal and ion-migration in the conductor can be semipermanently prevented, and excellent soldering can be realized.

As the inorganic ion-exchanger used in the present invention, there can be cited, for instance, natural materials and synthetic materials such as acid clay, dolomite and zeolite, and an inorganic ion-exchanger such as an anion-exchange type ion-exchanger, a cation-exchange type ion-exchanger or a dipolar ion-exchange type ion-exchanger comprising a series of inorganic compounds such as zirconium, tin, antimony, titanium, bismuth, magnesium and aluminum, and the like, which can capture ions such as a halogen ion. Among them, the inorganic ion-exchangers comprising a series of inorganic compounds are preferably used in the present invention because they have high ion-exchanging ability and high ion selectivity for the halogen ion such as chlorine ion or bromine ion, copper ion, tin ion, lead ion or the like. Examples of the inorganic ion-exchanger comprising a series of inorganic compounds are, for instance, IXE series commercially available from Toagosei Chemical Industry Co., Ltd. under the trade name of "IXE-700", "IXE-600", "IXE-500" and "IXE-300", and the like. However, the inorganic ion-exchanger used in the present invention is not limited to the exemplified ones and any inorganic ion-exchanger having a capacity equal to the above exemplified inorganic ion-exchanger can be used.

Moreover, in order to enlarge the area of the inorganic ion-exchanger contacted with a halogen ion, it is preferable that the inorganic ion-exchanger is a fine powder. In the present invention, the average particle diameter of the inorganic ion-exchanger is not particularly limited. However, it is generally preferable that the average particle diameter of the inorganic ion-exchanger is about 2 to about 3 $\mu$m.

As the activator containing a halogen atom used in the present invention, there can be preferably cited, for instance, amine salts of hydrohalogenic acids such as hydrochloric acid and hydrobromic acid, and the like because the amine salts of hydrohalogenic acids have moderate activity and corrosion resistance. Examples of an amine composing the above-mentioned amine salts are, for instance, a primary amine such as methylamine, ethylamine, n-butylamine, n-propylamine, cyclohexylamine, ethanolamine or aniline, a secondary amine such as dimethylamine, diethylamine or di-N-propylamine, a tertiary amine such as trimethylamine or triethylamine, and the like. The activator containing a halogen atom used in the present invention is not particularly limited to the exemplified ones and the activator containing a halogen atom can be used alone or in admixture thereof.

It is desired that the amount of the inorganic ion-exchanger and the activator containing a halogen atom in the flux for soldering of the present invention is adjusted so that the content of halogen in the activator is 0.008 to 10% by weight, preferably 0.01 to 5% by weight, more preferably 0.1 to 2% by weight based on the total amount of the flux for soldering and that the amount of the inorganic ion-exchanger is 0.3 to 50 g, preferably 0.5 to 40 g, more preferably 5 to 30 g per 1 g of the halogen of the activator.

When the content of halogen in the activator is less than the above lower limit, there is a tendency that soldering property of the flux for soldering is lowered and a solder ball is easily generated. On the other hand, when the content of halogen in the activator exceeds the above upper limit, there is a tendency that the flux for soldering cannot be continuously used in an atmosphere because the flux shows high hygroscopicity.

Also, when the amount of the inorganic ion-exchanger is less than the above lower limit, there is a tendency that corrosion resistance and metal ion-migration resistance are not sufficiently improved because the amount of the inorganic ion-exchanger does not provided the amount necessary for capturing all of the ions and thereby ability for capturing ions becomes small. On the other hand, when the amount of the inorganic ion-exchanger exceeds the above upper limit, there is a tendency that ability for capturing ions is not sufficiently improved there is an excessive amount of the inorganic ion-exchangers with respect to the amount of ions.

The flux for soldering of the present invention contains the inorganic ion-exchanger and the activator. In the present invention, a solvent, a thermoplastic resin and the like can be added to the flux for soldering in addition to the inorganic ion-exchanger and the activator.

The solvent used in the present invention is not particularly limited and the solvent which can dissolve or suspend the thermoplastic resin mentioned later can be used. Examples of the solvent are, for instance, an alcohol such as ethyl alcohol or isopropyl alcohol, a ketone such as methyl ethyl ketone or cyclohexanone, a glycol ether such as ethyl carbitol, butyl carbitol or hexyl carbitol and an acetic acid ester thereof, a polyol such as 1,5-heptanediol or 1,6-hexanediol, and the like. The solvent can be used alone or in admixture thereof.

When the amount of the solvent in the flux for soldering is too large, there is a tendency that the amount of solid matter becomes small and activity of the flux for soldering is lowered. On the other hand, when the amount of the solvent in the flux for soldering is too small, there is a tendency that viscosity of the flux for soldering increases and it is difficult to coat the soldering composition containing the flux for soldering on a substrate. Therefore, it is desired that the amount of the solvent is 10 to 99% by weight, preferably 30 to 97% by weight based on the total amount of the flux for soldering.

As the thermoplastic resin used in the present invention, there can be cited, for instance, a rosin such as a natural rosin such as gum rosin or wood rosin or a modified rosin such as hydrogenated rosin, disproportionated rosin, formyl rosin, a rosin ester resin or a polymerized rosin, and the like. In addition, a thermoplastic resin having a carboxyl group and showing thermosoftening property equal to the above-mentioned rosin can be used in the present invention. The thermoplastic resin used in the present invention is not particularly limited to the above exemplified ones, and the thermoplastic resin can be used alone or in admixture thereof.

Also, among them, a linear thermoplastic resin can be preferably used since a flux for soldering and a solder composition which give a flux residue having excellent film properties can be obtained, and a flux after soldering becomes soft and excellent in toughness.

When the amount of the thermoplastic resin in the flux for soldering is too large, there is a tendency that fluidity of the flux for soldering is lowered while soldering of the flux for soldering is carried out, so that soldering property is lowered. On the other hand, when the amount of the thermoplastic resin in the flux for soldering is too small, there is a tendency that strength of a resin film after soldering is lowered and crack is easily generated. Therefore, it desired that the amount of the thermoplastic resin is 1 to 90% by weight, preferably 3 to 70% by weight based on the total amount of the flux for soldering.

According to the present invention, after the film of oxide is removed by the activator contained in the flux for soldering, the inorganic ion-exchanger captures the activator. Therefore, soldering can be carried out without any problems and ion-migration is effectively prevented. In order to improve soldering property and metal ion-migration resistance, it is preferable that both the inorganic ion-exchanger and the activator are contained in the flux for soldering in the separated state to each other before soldering.

Separation of the inorganic ion-exchanger from the activator can be carried out, for instance, by covering either the inorganic ion-exchanger or the activator with a resin, or covering both the inorganic ion-exchanger and the activator with a resin.

As the resin which can be used for covering the inorganic ion-exchanger and the activator, there can be cited a resin which does not dissolve in the solvent for the flux at normal temperature but is compatible with the solvent for the flux when the resin and the solvent for the flux are mixed together and heated, or which shows plasticity when the resin is heated.

Examples of the above-mentioned resin are, for instance, polycarbonate, polysulfone, 6-nylon, polyurethane showing thermoplasticity, phenoxy resin, polyethersulfone, polybutylene terephthalate, acetel resin, polyethylene, polypropylene, polyethersilicone, butadiene-nitrile rubber having group in carboxyl its terminal, and the like, and the present invention is not limited to the exemplifed ones and any resin having the same properties as the above exemplified resins can be used. In the present invention, it is preferable that the resin has a linear chain and a number average molecular weight of about 3000 to about 60000.

In the present invention, as mentioned above, it is preferable that either the inorganic ion-exchanger or the activator is covered with the resin which does not dissolve in the solvent for the flux at normal temperature but is compatible with the solvent for the flux when the resin and the solvent for the flux are mixed together and heated, or which shows plasticity when the resin is heated, or both the inorganic ion-exchanger and the activator are covered with the resin which does not dissolve in the solvent for the flux at normal temperature but is compatible with the solvent for the flux when the resin and the solvent for the flux are mixed together and heated. Furthermore, when both the inorganic ion-exchanger and the activator are covered with the above-mentioned resin, it is more preferable that the softening point or compatible temperature of the resin with which the inorganic ion-exchanger is covered is different from the softening point or compatible temperature of the resin with which the activator is covered. In the present invention, the terminology "compatible temperature" is intended to mean a temperature at which the resin begins to mix with the other components in the solvent for the flux, or a temperature at which the resin begins to dissolve in the solvent for the flux.

Even though the softening point or compatible temperature of the resin with which the inorganic ion-exchanger is covered is lower than the softening point or compatible temperature of the resin with which the activator is covered, since it takes a long period of time for the inorganic ion-exchanger to capture ions such as a halogen ion, a layer of oxide can be removed by the activator while the inorganic ion-exchanger captures the ions, and therefore, the flux for soldering which can accomplish both excellent soldering and prevention of ion-migration can be obtained. It is more preferable that the softening point or compatible temperature of the resin with which the inorganic ion-exchanger is covered is higher than the softening point or compatible temperature of the resin with which the activator is covered because the layer of oxide removing property of the activator can be maintained for a long period of time.

As the resins with which the inorganic ion-exchanger and the activator are covered, it is preferable that the difference between the softening point or compatible temperature of the resin with which the inorganic ion-exchanger is covered and the softening point or compatible temperature of the resin with which the activator is covered is from about 30° to about 100° C.

In the present invention, a method for covering the inorganic ion-exchanger and the activator with the resin is not particularly limited. As the method for covering the inorganic ion-exchanger and the activator with the resin, there can be cited, for instance, a method for preparing a microcapsule of the inorganic ion-exchanger or the activator with the resin by means of a spraying method, a drying method in liquid, an electrostatic coating method, and the like.

A process for preparing the flux for soldering of the present invention is not particularly limited. As the process for preparing the flux for soldering, there can be cited, for instance, a general process for preparing a flux, comprising adding each of components such as the inorganic ion-exchanger, the activator and the thermoplastic resin to the solvent and stirring the resulting mixture at room temperature, and the like.

In the present invention, by using the above-mentioned flux for soldering and solder particles, there can be provided a solder composition which does not generate ion-migration even though cleaning is not carried out after soldering and which can realize excellent soldering.

As the solder particles used in the present invention, there can be cited, for instance, particles of tin-lead alloy, bismuth-lead alloy, bismuth-tin alloy, bismuth-tin-lead alloy, and the like. It is preferable that the weight ratio of tin to lead in the tin-lead alloy (Sn/Pb) is from about 50/50 to about 70/30, and the weight ratio of bismuth to lead in the bismuth-lead alloy (Bi/Pb) is from about 50/50 to about 70/30. However, the solder particles used in the present invention are not limited to the above exemplified ones.

Furthermore, in the present invention, the average particle diameter of the solder particles is not particularly limited. However, it is generally desired that the average particle diameter of the solder particles is about 5 to about 70 $\mu$m, preferably about 15 to about 40 $\mu$m from the viewpoint of printability of the solder composition.

It is desired that the ratio of the flux for soldering and the solder particles in the solder composition is adjusted so that the weight ratio of the flux for soldering to the solder particles ( flux for soldering/solder particles) is from 1/100 to 1/1, preferably from 1/20 to 1/5. When the weight ratio of the flux for soldering to the solder particles is less than the above lower limit, there is a tendency that it is difficult to apply the solder composition to a substrate by printing. On the other hand, when the weight ratio of the flux for soldering to the solder particles exceeds the above upper limit, there is a tendency that the amount of the solder composition applied after soldering becomes insufficient.

In order to more improve soldering property and metal ion-migration resistance, it is preferable that the inorganic ion-exchanger is separated from the activator in the solder composition before soldering.

Separation of the inorganic ion-exchanger from the activator can be carried out, for instance, by covering inorganic the either the ion-exchanger or activator with solder particles, by covering both the inorganic and the activator with solder ion-exchanger particles, or by covering one of the inorganic ion-exchanger and the activator with a resin or solder particles and covering the other with solder particles or a resin.

Examples of the solder particles with which the inorganic ion-exchanger and the activator can be covered are, for instance, the above-mentioned particles of the tin-lead alloy, the bismuth-lead alloy, the bismuth-tin alloy, the bismuth-tin-lead alloy, and the like. Examples of the resin with which the inorganic ion-exchanger and the activator can be covered are, for instance, the above-mentioned resin which does not dissolve in the solvent for the flux at normal temperature but is compatible with the solvent for the flux when the resin and the solvent for the flux are mixed together and heated, or which shows plasticity when the resin is heated, and the like.

In the present invention, as mentioned above, it is preferable that either the inorganic ion-exchanger or the activator is covered with the solder particles, or both the inorganic ion-exchanger and the activator are covered with the solder particles. When both the inorganic ion-exchanger and the activator are covered with the solder particles, it is more preferable that the melting point of the solder particles with which the inorganic ion-exchanger is covered is different from the melting point of the solder particles with which the activator is covered. Even though the melting point of the solder particles with which the inorganic ion-exchanger is covered is lower than the melting point of the solder particles with which the activator is covered, because it takes a long period of time for the inorganic ion-exchanger to capture ions, a layer of oxide can be removed by the activator while the inorganic ion-exchanger captures ions, and the solder composition which can accomplish both excellent soldering and prevention of ion-migration can be obtained. It is more preferable that the melting point of the solder particles with which the inorganic ion-exchanger is covered is higher than the melting point of the solder particles with which the activator is covered because the layer of oxide of the activator can be maintained for a long period of time.

As the solder particles with which the inorganic ion-exchanger is covered and the solder particles with which the activator is covered, it is preferable that the difference between the melting point of the solder particles with which the inorganic ion-exchanger is covered and the melting point of the solder particles with which the activator is covered is from about 30° to about 100° C.

Furthermore, in the present invention, as mentioned above, it is preferable that the inorganic ion-exchanger is covered with the resin and the activator is covered with the solder particles, or that the activator is covered with the resin and the inorganic ion-exchanger is covered with the solder particles. In this case, it is more preferable that the softening point or compatible temperature of the resin is different from the melting point of the solder particles.

Even though the melting point of the solder particles with which the inorganic ion-exchanger is covered is lower than the softening point or compatible temperature of the resin with which the activator is covered, or the softening point or compatible temperature of the resin with which the inorganic ion-exchanger is covered is lower than the melting point of the solder particles with which the activator is covered, because it takes a long period of time for the inorganic ion-exchanger to capture ions, a layer of oxide can be removed by the activator while the inorganic ion-exchanger captures ions, the solder composition which shows both excellent soldering properties and prevention of ion-migration can be provided. It is more preferable that the melting point of the solder particles with which the inorganic ion-exchanger is covered is higher than the softening point or compatible temperature of the resin with which the activator is covered, or the softening point or compatible temperature of the resin with which the inorganic ion-exchanger is covered is higher than the melting point of the solder particles with which the activator is covered because the layer of oxide removing property of the activator can be maintained for a long period of time.

As the solder particles with which the inorganic ion-exchanger is covered and the resin with which the activator is covered, or as the resin with which the inorganic ion-exchanger is covered and the solder particles with which the activator is covered, it is preferable that the difference between the melting point of the solder particles and the softening point or compatible temperature of the resin is from about 30° to about 100° C.

Moreover, the inorganic ion-exchanger may be in the state that the inorganic ion-exchanger can capture ions which remain after soldering, and it is preferable that the melting point of the solder particles with which the inorganic ion-exchanger is covered or the softening point or compatible temperature of the resin with which the inorganic ion-exchanger is covered is not less than the melting point of the obtained solder composition.

In the present invention, a method for covering the inorganic ion-exchanger and the activator with the solder particles is not particularly limited. As the method for covering the inorganic ion-exchanger and the activator with the solder particles, there can be cited, for instance, a process for preparing a microcapsule of the inorganic ion-exchanger or the activator by using the solder particles in accordance with a vacuum evaporation method, and the like. Moreover, a method for covering the inorganic ion-exchanger and the activator with the resin is not particularly limited, and as the method for covering the inorganic ion-exchanger and the activator with the resin, there can be cited, for instance, the above-mentioned process for preparing a microcapsule by using the resin, and the like.

A process for preparing the solder composition of the present invention is not particularly limited. As the process for preparing the solder composition, there can be cited, for instance, a general process comprising kneading the flux for soldering, organic components comprising the activator, the solder particles and, if necessary, another components and the like by means of, for instance, a triple roller kneader at from about 10° to about 50° C. for from about 1 to about 30 minutes, and the like.

The solder composition of the present invention contains a flux for soldering comprising the inorganic ion-exchanger and the activator and the solder particles. Moreover, if necessary, in addition to the above-mentioned inorganic ion-exchanger and the activator, additives such as a thixotropic agent such as castor wax and a viscosity controlling agent (thickening agent) can be added to the solder composition. The above-mentioned additives can be kneaded together with the inorganic ion-exchanger, the organic components such as the activator, the solder particles and the like.

In the present invention, by using the above-mentioned solder composition, soldering can be preferably carried out.

A soldering method of the present invention by using the above-mentioned solder composition (hereinafter referred to as "Soldering method (I)") comprises a step of coating the solder composition on a portion for soldering of a substrate.

A method for coating the solder composition on the portion for soldering of the substrate is not particularly limited. As the method for coating the solder composition on the portion for soldering, there can be cited, for instance, a method for printing the solder composition through a mask, and the like. The amount of the solder composition which is coated on the portion for soldering is not particularly limited and can be suitably adjusted as occasion demands. It is preferable that the amount of the solder composition which is coated on the portion for soldering is generally adjusted to about 0.01 to about 0.4 g/cm$^2$. Moreover, after coating the soldering composition on the portion for soldering, the portion for soldering coated with the soldering composition can be allowed to stand as it is, and if necessary, the portion for soldering coated with the soldering composition can be heated, for instance, at from about 20° to about 40° C.

When the portion for soldering coated with the soldering composition is heated, it is preferable to use a solder composition which is prepared within about 2 hours before heating the portion for soldering coated with the soldering composition. If the mixture of the activator and the inorganic ion-exchanger is left for a long period of time, there is a possibility that active ions contained in the activator are captured by the inorganic ion-exchanger before soldering.

Also, in the present invention, soldering can be preferably carried out by a soldering method other than the above-mentioned Soldering method (I) (hereinafter referred to as "Soldering method (II)").

The above-mentioned Soldering method (II) comprises a step of coating a flux containing an activator on a portion for soldering, a step of applying an inorganic ion-exchanger to the portion for soldering and a step of applying a solder to the portion for soldering.

The Soldering method (II) has a step of coating the flux containing the activator on the portion for soldering besides a step of applying an inorganic ion-exchanger to the portion for soldering. When the Soldering method (II) is employed, for instance, excellent effects, such that corrosion resistance of an electrically conductive metal and ion-migration between conductors are semipermanently imparted to a substrate after soldering, are exhibited.

As the activator and the inorganic ion-exchanger used in the Soldering method (II), there can be cited, for instance, the same activator and and inorganic ion-exchanger as used in flux for soldering and the solder composition of the present invention, and the like. As the solder used in the Soldering method (II), there can be cited, for instance, a solder comprising the solder particles used in the solder composition and the like. To the flux containing the activator used in the Soldering method (II), there can be added a solvent, a thermoplastic resin and the like which can be used in the flux for soldering of the present invention.

A method for coating the flux containing the activator on the portion for soldering is not particularly limited. As the method for coating the flux containing the activator on the portion for soldering, there can be cited, for instance, a method comprising using a foam fluxer, and the like. The amount of the flux containing the activator which is coated on the portion for soldering is not particularly limited and can be adjusted as occasion demands. It is preferable that the amount of the flux which is coated on the portion for soldering is generally adjusted to be about $1 \times 10^{-5}$ to about $5 \times 10^{-1}$ g/cm$^2$.

A method for applying the inorganic ion-exchanger to the portion for soldering is not particularly limited. As the method for applying the inorganic ion-exchanger to the portion for soldering, there can be cited, for instance, a method comprising coating an organic solvent such as ethyl alcohol, in which the inorganic ion-exchanger is dispersed, on the portion for soldering by means of air spray, and the like. The amount of the inorganic ion-exchanger which is applied to the portion for soldering is not particularly limited and can be adjusted as occasion demands. It is preferable that the amount of the inorganic ion-exchanger which is applied to the portion for soldering is generally adjusted to about $1 \times 10^{-4}$ to about 1 g/cm$^2$.

A method for applying the solder to the portion for soldering is not particularly limited. As the method for applying the solder to the portion for soldering, there can be cited, for instance, a method comprising dipping a substrate having a portion for soldering in molten solder for about 1 to about 30 seconds, and the like. The amount of the solder which is applied to the portion for soldering is not particularly limited and can be adjusted as occasion demands. It is preferable that the amount of the solder which is applied to the portion for soldering is generally adjusted to about 0.01 to about 0.4 g/cm$^2$.

In the Soldering method (II), the ratio of the inorganic ion-exchanger, the activator and the solder can be adjusted so that the ratio satisfies the ratio of the inorganic ion-exchanger and the activator contained in the flux for soldering and the ratio of the flux for soldering and the solder particles which are used in the solder composition.

Furthermore, in the present invention, soldering can be carried out by a soldering method other than the Soldering method (I) and Soldering method (II) (hereinafter referred to as "Soldering method (III)").

The Soldering method (III) comprises a step of mixing an inorganic ion-exchanger with a creamy solder to give a mixture, a step of coating the mixture on a circuit pattern of a wiring plate and a step of heating the wiring plate.

In the Soldering method (III) (reflow soldering method), the inorganic ion-exchanger is previously mixed with the creamy solder and the resulting mixture is coated one a circuit pattern of the wiring plate. When the Soldering method (III) is employed, for instance, excellent effects, such that corrosion resistance of an electrically conductive metal and ion-migration between conductors are semipermanently imparted to a substrate after soldering, are exhibited.

As the inorganic ion-exchanger used in the Soldering method (III), there can be cited, for instance, the same inorganic ion-exchanger as used in the flux for soldering and the solder composition of the present invention, and the like. As the creamy solder used in the Soldering method (III), there can be cited, for instance, a creamy solder comprising the above-mentioned activator, the solvent, the thermoplastic resin and the solder particles which are used in the flux for soldering and the solder composition, and the like.

In the Soldering method (III), it is preferable that the mixing ratio of the creamy solder and the inorganic ion-exchanger is adjusted so that the ratio of the inorganic ion-exchanger, the activator, the solvent, the thermoplastic resin, the solder particles and the like satisfies the ratio of each components in the solder composition of the present invention. It is more preferable that, for instance, the inorganic ion-exchanger is mixed with the creamy solder in a ratio of about 0.01 to about 2% by weight of the creamy solder.

Furthermore, it is preferable to use a mixture of the inorganic ion-exchanger and the creamy solder which is prepared within about 2 hours before coating. If the mixture is left for a long period of time, there is a possibility that active ions of the activator in the creamy solder are captured by the inorganic ion-exchanger before soldering.

A method for coating the mixture on the circuit pattern of the wiring plate is not particularly limited. As the method for coating the mixture on the circuit pattern of the wiring plate, there can be cited, for instance, a method in which a screen printer for solder paste and the like are used. The amount of the mixture which is coated on the circuit pattern is not particularly limited, and can be suitably adjusted as occasion demands. It is preferable that the amount of the mixture which is coated on the circuit pattern is generally adjusted to about 0.01 to about 0.4 g/cm$^2$.

Also, in the Soldering method (III), a step of loading electronic parts on a portion coated with the mixture can be employed before heating of the wiring plate, and a method for loading electronic parts on the portion coated with the mixture is not particularly limited.

A method for heating the wiring plate is not particularly limited. As the method for heating the wiring plate, there can be cited, for instance, a method comprising heating the wiring plate in a hot-air (reflow) furnance and the like. Heating temperature of the wiring plate is not particularly limited, however, from the viewpoint of prevention of damage to the electronic parts and the wiring plate by heating the wiring plate, it is preferable that the heating temperature is from about 200° to about 250° C.

The present invention is more specifically described and explained by means of the following Examples wherein all parts are parts by weight unless otherwise noted. It is to be understood that the present invention is not limited to the Examples, and various changes and modifications may be made in the invention without departing from the spirit and scope thereof.

EXAMPLES 1 TO 3

After 25 parts of gum rosin as a thermoplastic resin, 70 parts of isopropyl alcohol ( special grade chemical) as a solvent and 0.8 part of ethylamine salt of hydrochloric acid as an activator containing a halogen atom were mixed together, thereto was added 0.2 part (Example 1), 1.5 parts (Example 2) or 5.0 parts (Example 3) of an inorganic ion-exchanger commercially available from Toagosei Chemical Industry Co., Ltd. under the trade name of "IXE-700" (the anion-exchange type inorganic ion-exchanger comprising magnesium and aluminum, particle diameter: 7 to 8 μm), and they were stirred at room temperature to give a flux for soldering.

By using the obtained flux for soldering, ion-migration test was carried out according to the following method, and insulation degradation time was measured. The results are shown in Table 1.

[Ion-migration test]

Figure 2:
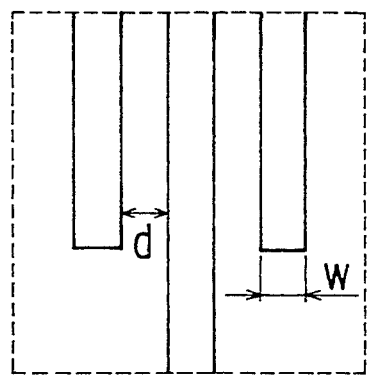
FIG. 2 is an enlarged view of a portion surrounded with a broken line in the schematic illustrative drawing of FIG. 1.

As a substrate for ion-migration test, a substrate in the form as shown in FIG. 1 was used. FIG. 1 is a schematic illustrative drawing showing a substrate for ion-migration test. In FIG. 1, 1 and 2 denote a terminal for connecting with an external electrode, respectively. FIG. 2 is an enlarged view of a portion surrounded with a broken line in the schematic illustrative drawing of FIG. 1. In FIG. 2, W denotes a width of line (conductor width), and d denotes an interval of line (conductor spacing). The substrate shown in FIG. 1 was produced by forming 40 comb-type pattern electrodes made of copper on a glass-epoxy resin laminate (FR-4) having a thickness of 1.6 mm so that the width of line (W) became 0.165 mm and the interval of line (d) became 0.165 mm in accordance with a substractive method.

The obtained flux for soldering was uniformly applied to the whole comb pattern electrodes formed on the substrate for ion-migration test by means of an injector so that the amount of the flux for soldering which was coated on the whole comb pattern electrodes was 0.2 g/cm$^2$, then the coated substrate for ion-migration test was dried in a hot-air drying oven at 120° C. for 5 minutes to give a sample.

The obtained sample was put in an air-conditioned bath having a temperature of 85° C. and a RH (relative humidity) of 85% and an impressed voltage of DC (direct current) 50 V was applied between throughholes. During the application of DC voltage, the change of electric resistance between the comb-type patterns was measured with the passage of time to examine ion-migration. The period of time when the electric resistance attains to $10^7$ Ω was measured, and that time was regarded as an insulation degradation time (hour(s)) based upon the generation of ion-migration.

Comparative Example 1

After 25 parts of gum rosin, 70 parts of isopropyl alcohol (special grade chemical) and 0.8 part of ethylamine salt of hydrochloric acid were mixed together, they were stirred at room temperature to give a flux.

By using the obtained flux, a sample was produced, and the ion-migration test of the obtained sample was carried out and insulation degradation time was measured in the same manner as in Example 1. The results are shown in Table 1.

Comparative Example 2

After 3 parts of gum rosin, 95 parts of isopropyl alcohol (special grade chemical) and 2 parts of adipic acid were mixed together, they were stirred at room temperature to give an organic acid type low-solid flux which is generally recognized to be excellent in ion-migration resistance.

By using the obtained flux, a sample was produced, and the ion-migration test of the obtained sample was carried out and insulation degradation time was measured in the same manner as in Example 1. The results are shown in Table 1.

In addition, the content (% by weight) of halogen in the activator based on the total amount of the flux for soldering, and the amount of the inorganic ion-exchanger (g) per 1 g of the halogen of the activator are also shown in Table 1.

TABLE I

| | Components of the composition (part(s)) | | | | | | | Physical property |
|---|---|---|---|---|---|---|---|---|
| | Inorganic ion-exchanger | | Ethylamine salt of hydrochloric acid | | Components of the composition (part(s)) | | | |
| | Kinds and amount (part(s)) | Amount (g) per 1 g of halogen | Amount (part(s)) | Content of halogen (% by weight) | Adipic acid | Gum rosin | Isopropyl alcohol | Insulation degradation time (hour(s)) |
| Ex. No. | | | | | | | | |
| 1 | IXE-700 (0.2) | 0.82 | 0.8 | 0.024 | — | 25 | 70 | 500 |
| 2 | IXE-700 (1.5) | 6.2 | 0.8 | 0.024 | — | 25 | 70 | ≧2000 |
| 3 | IXE-700 (5.0) | 20.6 | 0.8 | 0.024 | — | 25 | 70 | ≧2000 |
| Com. Ex. | | | | | | | | |
| 1 | — | — | 0.8 | 0.024 | — | 25 | 70 | 80 |
| 2 | — | — | — | — | 2 | 3 | 95 | 250 |

As is clear from the results shown in Table 1, when the fluxes for soldering obtained in Examples 1 to 3 are used, the insulation degradation time becomes longer in comparison with the insulation degradation time when the fluxes obtained in Comparative Examples 1 to 2 are used. Therefore, it can be understood that the fluxes for soldering obtained in Examples 1 to 3 exhibit excellent metal ion-migration resistance.

EXAMPLE 4

After 25 parts of gum rosin, 70 parts of isopropyl alcohol (special grade chemical) and 0.8 part of ethylamine salt of hydrochloric acid were mixed together, thereto was added 1.5 parts of an inorganic ion-exchanger commercially available from Toagosei Chemical Industry Co., Ltd. under the trade name of "IXE-500" (the anion-exchange type inorganic ion-exchanger comprising bismuth, particle diameter: 2 to 3 μm), and they were stirred at room temperature to give a flux for soldering.

By using the obtained flux for soldering, a sample was produced, and the ion-migration test of the obtained sample was carried out and insulation degradation time was measured in the same manner as in Example 1. The result is shown in Table 2.

EXAMPLE 5

After 25 parts of gum rosin, 70 parts of isopropyl alcohol (special grade chemical) and 0.8 part of ethylamine salt of hydrochloric acid were mixed together, thereto was added 1.5 parts of an inorganic ion-exchanger commercially available from Toagosei Chemical Industry Co., Ltd. under the trade name of "IXE-600" (the dipolar ion-exchange type inorganic ion-exchanger comprising antimony and bismuth, particle diameter: 2 to 3 μm), and they were stirred at room temperature to give a flux for soldering.

By using the obtained flux for soldering, a sample was produced, and the ion-migration test of the obtained sample was carried out and insulation degradation time was measured in the same manner as in Example 1. The result is shown in Table 2.

EXAMPLE 6

After 25 parts of gum rosin, 70 parts of isopropyl alcohol (special grade chemical) and 0.8 part of ethylamine salt of hydrochloric acid were mixed together, thereto was added 1.5 parts of an inorganic ion-exchanger commercially available from Toagosei Chemical Industry Co., Ltd. under the trade name of "IXE-300" (the cation-exchange type inorganic ion-exchanger comprising antimony, particle diameter: 2 to 3 μm), and they were stirred at room temperature to give a flux for soldering.

By using the obtained flux for soldering, a sample was produced, and the ion-migration test of the obtained sample was carried out and insulation degradation time was measured in the same manner as in Example 1. The result is shown in Table 2.

In addition, the content (% by weight) of halogen in the activator based on the total amount of the flux for soldering, and the amount of the inorganic ion-exchanger (g) per 1 g of the halogen of the activator are also shown in Table 2.

TABLE 2

| | Components of the composition (part(s)) | | | | | | Physical property |
|---|---|---|---|---|---|---|---|
| | Inorganic ion-exchanger | | Ethylamine salt of hydrochloric acid | | Components of the composition (part(s)) | | |
| Ex. No. | Kinds and amount (part(s)) | Amount (g) per 1 g of halogen | Amount (part(s)) | Content of halogen (% by weight) | Gum rosin | Isopropyl alcohol | Insulation degradation time (hour(s)) |
| 4 | IXE-500 (1.5) | 6.2 | 0.8 | 0.24 | 25 | 70 | ≧2000 |
| 5 | IXE-600 (1.5) | 6.2 | 0.8 | 0.24 | 25 | 70 | ≧2000 |
| 6 | IXE-300 (1.5) | 6.2 | 0.8 | 0.24 | 25 | 70 | 1500 |

As is clear from the results shown in Table 2, when the fluxes for soldering obtained in Examples 4 to 6 are used, insulation degradation time becomes long. Therefore, it can be understood that the fluxes for soldering obtained in Examples 4 to 6 exhibit excellent metal ion-migration resistance.

EXAMPLE 7

After 5.5 parts of disproportionated rosin as a thermoplastic resin, 4.0 parts of butyl carbitol (special grade chemical) as a solvent, 0.04 part of ethylamine salt of hydrochloric acid and 0.03 part of ethylamine salt of hydrobromic acid as an activator containing a halogen atom and 0.5 part of castor wax as a thixotropic agent were mixed together, thereto were added 0.15 part of an inorganic ion-exchanger "IXE-700" and 90 parts of eutectic solder particles (tin-lead alloy, Sn:Pb (weight ratio)=60:40, particle diameter: 20 to 40 μm), and they were kneaded by using a triple roller kneader at 50° C. for 10 minutes to give a solder composition.

The obtained solder composition was coated on a substrate for ion-migration test having a shape shown in FIG. 1 by using a mask made of stainless steel having a thickness of 100 μm and a shape corresponding to the comb pattern of the substrate as shown in FIG. 1, so that the amount of the solder composition which was coated on the comb pattern electrode was $1 \times 10^{-4}$ g/cm², and the coated substrate for ion-migration test was heated at 220° C. for 15 minutes in a hot-air (reflow) furnace to give a sample.

The ion-migration test of the obtained sample was carried out and insulation degradation time was measured in the same manner as in Example 1 except that the obtained sample was used instead of the sample of Example 1. The result is shown in Table 3.

EXAMPLE 8

After 5.5 parts of disproportionated rosin, 4.0 parts of butyl carbitol (special grade chemical), 0.04 part of ethylamine salt of hydrochloric acid, 0.03 part of ethylamine salt of hydrobromic acid and 0.5 part of castor wax were mixed together, thereto were added 0.15 part of an inorganic ion-exchanger "IXE-600" and 90 parts of the same eutectic solder particles as used in Example 7, and they were kneaded in the same manner as in Example 7 to give a solder composition.

By using the obtained solder composition, a sample was produced, and the ion-migration test of the obtained sample was carried out and insulation degradation time was measured in the same manner as in Example 7. The result is shown in Table 3.

EXAMPLE 9

After 5.5 parts of disproportionated rosin, 4.0 parts of butyl carbitol (special grade chemical), 0.04 part of ethylamine salt of hydrochloric acid, 0.03 part of ethylamine salt of hydrobromic acid and 0.5 part of castor wax were mixed together, thereto were added 0.15 part of an inorganic ion-exchanger "IXE-300" and 90 parts of the same eutectic solder particles as used in Example 7, and they were kneaded in the same manner as in Example 7 to give a solder composition.

By using the obtained solder composition, a sample was produced, and the ion-migration test of the obtained sample was carried out and insulation degradation time was measured in the same manner as in Example 7. The result is shown in Table 3.

Comparative Example 3

After 5.5 parts of disproportionated rosin, 4.0 parts of butyl carbitol (special grade chemical), 0.04 part of ethylamine salt of hydrochloric acid, 0.03 part of ethylamine salt of hydrobromic acid and 0.5 part of castor wax were mixed together, thereto was added 90 parts of the same eutectic solder particles as used in Example 7, and they were kneaded in the same manner as in Example 7 to give a solder composition.

By using the obtained solder composition, a sample was produced, and the ion-migration test of the obtained sample was carried out and insulation degradation time was measured in the same manner as in Example 7. The result is shown in Table 3.

In addition, the content (% by weight) of halogen in the activator based on the total amount of the inorganic ion-exchanger, the activator, butyl carbitol and disproportionated rosin of the solder composition, and the amount of the inorganic ion-exchanger (g) per 1 g of the halogen of the activator are also shown in Table 3.

In Table 3, ethylamine salt of hydrochloric acid is shown as "EACl", and ethylamine salt of hydrobromic acid is shown as "EABr".

TABLE 3

| | Components of the composition (part(s)) | | | | Components of the composition (part(s)) | | | | Physical property |
|---|---|---|---|---|---|---|---|---|---|
| Inorganic ion-exchanger | | Activator | | | | | | | |
| Kinds and amount (part(s)) | Amount (g) per 1 g of halogen | Kinds and amount (part(s)) | Content of halogen (% by weight) | Dispro- portionated rosin | Butyl carbitol | Castor wax | Solder particles | Insulation degradation time (hour(s)) |
| Ex. No. | | | | | | | | | |
| 7 | IXE-700 (0.15) | 6.0 | EACl (0.04) EABr (0.03) | 0.025 | 5.5 | 4.0 | 0.5 | 90 | ≧2000 |
| 8 | IXE-600 (0.15) | 6.0 | EACl (0.04) EABr (0.03) | 0.025 | 5.5 | 4.0 | 0.5 | 90 | ≧2000 |
| 9 | IXE-300 (0.15) | 6.0 | EACl (0.04) EABr (0.03) | 0.025 | 5.5 | 4.0 | 0.5 | 90 | 1500 |
| Com. Ex. | | | | | | | | | |
| 3 | — | — | EACl (0.04) EABr (0.03) | 0.025 | 5.5 | 4.0 | 0.5 | 90 | 110 |

As is clear from the results shown in Table 3, when the solder compositions obtained in Examples 7 to 9 are used, the insulation degradation time becomes longer in comparison with the insulation degradation time when the solder composition obtained in Comparative Example 3 is used. Therefore, it can be understood that the solder compositions obtained in Examples 7 to 9 exhibit excellent metal ion-migration resistance.

EXAMPLE 10

After 25 parts of gum rosin, 70 parts of isopropyl alcohol (special grade chemical) and 0.8 part of ethylamine salt of hydrochloric acid were mixed together, thereto was added 2.5 parts of a microcapsule prepared by covering the inorganic ion-exchanger "IXE-700" with polycarbonate having a softening point of 132° C. by means of a spraying method, and they were stirred at room temperature to give a flux for soldering.

The content of halogen in the activator based on the total amount of the obtained flux for soldering (hereinafter referred to as "amount of halogen") was 0.24% by weight, and the amount of the inorganic ion-exchanger per 1 g of the halogen of the activator (hereinafter referred to as "amount of the inorganic ion-exchanger") was 10.3 g.

By using the obtained flux for soldering, wettability test was carried out according to the following method.

[Wettability test]

A copper plate was coated with a flux for soldering just after prepared or a flux for soldering which had been previously stored in a refrigerator at 5° C. for 120 hours or 1200 hours in an amount of $2.0 \times 10^{-3}$ g/cm$^2$, and a formed film was dried for 1 minute. After that, wettability of the formed film was evaluated by means of a menisco graph commercially available from RHESCA under the trade name of "Solderchecker ST-2000". The copper plate which was used in this wettability test was a non-oxidizable copper plate (40 mm × 40 mm × 0.3 mm), and the copper plate was previously heated in an air-conditioned bath at 100° C., at 150° C. or at 200° C. for 10 minutes and oxidized before coating the flux for soldering, respectively. Wettability test was carried out by measuring zero-cross time (seconds), which was an index of wettability of a solder in a solder bath at 240° C. under the condition that a soaking depth was 2 mm and a soaking rate was 8 mm/minute.

As a result, when the copper plate was coated with the flux for soldering just after prepared, zero-cross time of the copper plate oxidized at each temperature was not more than 1.0 second. When the copper plate was coated with the flux for soldering which was previously stored in a refrigerator at 5° C. for 120 hours or the copper plate was coated with the flux for soldering which was previously stored in a refrigerator at 5° C. for 1200 hours, zero-cross time of the copper plate oxidized at temperature was each not more than 1.0 second.

Furthermore, by using the above-mentioned three kinds of the fluxes for soldering, ion-migration test was carried out and insulation degradation time was measured in the same manner as in Example 1.

As a result, in any cases, insulation degradation time was not less than 2000 hours irrespective of the storage period of the flux for soldering.

EXAMPLE 11

After 5.5 parts of disproportionated rosin, 4.0 parts of 1,6-hexanediol (special grade chemical), 0.04 part of ethylamine salt of hydrochloric acid, 0.03 part of ethylamine salt of hydrobromic acid and 0.5 part of castor wax were mixed together, thereto were added 0.25 part of a microcapsule, which was prepared by covering an inorganic ion-exchanger "IXE-700" with polycarbonate having a softening point of 132° C. by means of a spraying method, and 90 parts of the same eutectic solder particles as used in Example 7, and they were kneaded in the same manner as in Example 7 to give a solder composition.

The content of halogen in the activator based on the total amount of the inorganic ion-exchanger, the activator, 1,6-hexanediol and the disproportionated rosin contained in the obtained solder composition (hereinafter referred to as "amount of halogen") was 0.025% by weight, and the amount of the inorganic ion-exchanger per 1 g of the halogen of the activator (hereinafter referred to as "amount of the inorganic ion-exchanger") was 9.98 g.

By using the obtained solder composition, spread test was carried out according to the following method.

[Spread test]

In accordance with Item 6.10 of JIS (Japanese Industrial Standards) Z 3197, spread test was carried out by using 0.3 g of the solder composition just after prepared or 0.3 g of the solder composition which had been previously stored in a refrigerator at 5° C. for 120 hours or 1200 hours, and spread percentage (%) was measured.

As a result, in any cases, spread percentage was not less than 90% irrespective of the storage period of the solder composition.

Furthermore, by using the above-mentioned three kinds of the solder compositions, a sample was produced, and the ion-migration test was carried out and insulation degradation time was measured in the same manner as in Example 7.

As a result, in any cases, insulation degradation time was not less than 2000 hours irrespective of the storage period of the solder composition.

EXAMPLE 12

After 25 parts of gum rosin, 70 parts of isopropyl alcohol (special grade chemical) and 1.3 parts of a microcapsule containing 0.8 part of ethylamine salt of hydrochloric acid, which was prepared by covering ethylamine salt of hydrochloric acid with polycarbonate having a softening point of 132° C. by means of a spraying method were mixed together, thereto was added 1.5 parts of an inorganic ion-exchanger "IXE-700", and they were stirred at room temperature to give a flux for soldering.

The content of halogen was 0.39 % by weight and the amount of the inorganic ion-exchanger was 3.8 g.

By using the obtained flux for soldering, a film was formed, and the wettability test of the formed film was carried out and zero-cross time was measured in the same manner as in Example 10.

As a result, in any cases, zero-cross time was not more than 1.0 second irrespective of the storage period of the flux for soldering.

Furthermore, by using the obtained flux for soldering, a sample was produced, and the ion-migration test of the obtained sample was carried out and insulation degradation time was measured in the same manner as in Example 10.

As a result, in any cases, insulation degradation time was not less than 2000 hours irrespective of the storage period of the flux for soldering.

EXAMPLE 13

After 5.5 parts of disproportionated rosin, 4.0 parts of 1,6-hexanediol (special grade chemical), 0.5 part of castor wax and 0.13 part of a microcapsule containing 0.08 part of ethylamine salt of hydrochloric acid, which was prepared by covering ethylamine salt of hydrochloric acid with polycarbonate having a softening point of 132° C. by means of a spraying method were mixed together, thereto were added 0.15 part of an inorganic ion-exchanger "IXE-600" and 90 parts of the same eutectic solder particles having a melting point of 183° C. as used in Example 7, and they were kneaded in the same manner as in Example 7 to give a solder composition.

The content of halogen was 0.039% by weight and the amount of the inorganic ion-exchanger was 3.8 g.

By using the obtained solder composition, the spread test was carried out and spread percentage was measured in the same manner as in Example 11.

As a result, in any cases, spread percentage was not less than 90% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 14

After 25 parts of gum rosin, 70 parts of isopropyl alcohol (special grade chemical) and 1.3 parts of the microcapsule containing 0.8 part of ethylamine salt of hydrochloric acid, which was prepared by covering ethylamine salt of hydrochloric acid with polysulfone having a softening point of 150° C. by means of a drying method in liquid were mixed together, thereto was added 2.5 parts of the microcapsule prepared by covering an inorganic ion-exchanger "IXE-600" with polycarbonate having a softening point of 132° C. by means of a spraying method, and they were stirred at room temperature to give a flux for soldering.

The content of halogen was 0.24% by weight and the amount of the inorganic ion-exchanger was 10.3 g.

By using the obtained flux for soldering, a film was formed, and the wettability test of the formed film was carried out and zero-cross time was measured in the same manner as in Example 10.

As a result, in any cases, zero-cross time was not more than 1.0 second irrespective of the storage period of the flux for soldering.

Furthermore, by using the obtained flux for soldering, a sample was produced, and the ion-migration test of the obtained sample was carried out and insulation degradation time was measured in the same manner as in Example 10.

As a result, in any cases, insulation degradation time was not less than 2000 hours irrespective of the storage period of the flux for soldering.

EXAMPLE 15

After 5.5 parts of disproportionated rosin, 4.0 parts of 1,6-hexanediol (special grade chemical), 0.5 part of castor wax and 0.15 part of a microcapsule containing 0.08 part of ethylamine salt of hydrochloric acid, which was prepared by covering ethylamine salt of hydrochloric acid with polysulfone having a softening point of 150° C. by means of a drying method in liquid were mixed together, thereto were added 0.25 part of the microcapsule prepared by covering an inorganic ion-exchanger "IXE-600" with polycarbonate having a softening point of 132° C. by means of a spraying method and 90 parts of the same eutectic solder particles having a melting point of 183° C. as used in Example 7, and they were kneaded in the same manner as in Example 7 to give a solder composition.

The content of halogen was 0.024% by weight and the amount of the inorganic ion-exchanger was 10.3 g.

By using the obtained solder composition, the spread test was carried out and spread percentage was measured in the same manner as in Example 11.

As a result, in any cases, spread percentage was not less than 90% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 16

After 25 parts of gum rosin, 70 parts of isopropyl alcohol (special grade chemical) and 1.3 parts of a microcapsule containing 0.8 part of ethylamine salt of hydrochloric acid, which was prepared by covering ethylamine salt of hydrochloric acid with polycarbonate having a softening point of 132° C. by means of a spraying method were mixed together, thereto was added 2.5 parts of a microcapsule prepared by covering an inorganic ion-exchanger "IXE-600" with 6-nylon having a softening point of 220° C. by means of an electrostatic coating method, and they were stirred at room temperature to give a flux for soldering.

The content of halogen was 0.24% by weighlt and the amount of the inorganic ion-exchanger was 10.3 g.

By using the obtained flux for soldering, a film was formed, and the wettability test of the formed film was carried out and zero-cross time was measured in the same manner as in Example 10.

As a result, in any cases, zero-cross time was not more than 0.6 second irrespective of the storage period of the flux for soldering.

Furthermore, by using the obtained flux for soldering, the sample was produced, and the ion-migration test of the obtained sample was carried out and insulation degradation time was measured in the same manner as in Example 10.

As a result, in any cases, insulation degradation time was not less than 2000 hours irrespective of the storage period of the flux for soldering.

EXAMPLE 17

After 5.5 parts of disproportionated rosin, 4.0 parts of 1,6-hexanediol (special grade chemical), 0.5 part of castor wax and 0.15 part of a microcapsule containing 0.08 part of ethylamine salt of hydrochloric acid, which was prepared by covering ethylamine salt of hydrochloric acid with polycarbonate having a softening point of 132° C. by means of a spraying method were mixed together, thereto were added 0.25 part of the microcapsule prepared by covering an inorganic ion-exchanger "IXE-600" with 6-nylon having a softening point of 220° C. by means of an electrostatic coating method and 90 parts of the same eutectic solder particles having a melting point of 183° C. as used in Example 7, and they were kneaded in the same manner as in Example 7 to give a solder composition.

The content of halogen was 0.24% by weight and the amount of the inorganic ion-exchanger was 10.3 g.

By using the obtained solder composition, the spread test was carried out and spread percentage was measured in the same manner as in Example 11.

As a result, in any cases, spread percentage was not less than 93% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 18

After 5.5 parts of disproportionated rosin, 4.0 parts of 1,6-hexanediol (special grade chemical), 0.04 part of ethylamine salt of hydrochloric acid, 0.03 part of ethylamine salt of hydrobromic acid and 0.5 part of castor wax were mixed together, thereto were added 8 parts of a microcapsule containing 0.2 part of an inorganic ion-exchanger "IXE-500", which was prepared by covering the inorganic ion-eXchanger "IXE-500" with the same eutectic solder particles having a melting point of 183° C. as used in Example 7 by means of a vacuum evaporation method and 82 parts of the above-mentioned eutectic solder particles having a melting point of 183° C., and they were kneaded in the same manner as in Example 7 to give a solder composition.

The content of halogen was 0.013% by weight and the amount of the inorganic ion-exchanger was 15.4 g.

By using the obtained solder composition, the spread test was carried out and spread percentage was measured in the same manner as in Example 11.

As a result, in any cases, spread percentage was not less than 94% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 19

After 5.5 parts of disproportionated rosin, 4.0 parts of 1,6-hexanediol (special grade chemical), 0.5 part of castor wax and 0.15 part of a microcapsule containing 0.08 part of ethylamine salt of hydrochloric acid, which was prepared by covering ethylamine salt of hydrochloric acid with polysulfone having a softening point of 188° C. by means of a drying method in solution were mixed together, thereto were added 8 parts of a microcapsule containing 0.2 part of an inorganic ion-exchanger "IXE-600", which was prepared by covering an inorganic ion-exchanger "IXE-600" with the same eutectic solder particles having a melting point of 183° C. as used in Example 7 by means of a vacuum evaporation method and 82 parts of the above-mentioned eutectic solder particles having a melting point of 183° C., and they were kneaded in the same manner as in Example 7 to give a solder composition.

The content of halogen was 0.024% by weight and the amount of the inorganic ion-exchanger was 8.2 g.

By using the obtained solder composition, the spread test was carried out and spread percentage was measured in the same manner as in Example 11.

As a result, in any cases, spread percentage was not less than 90% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 20

After 5.5 parts of disproportionated rosin, 4.0 parts of 1,6-hexanediol (special grade chemical), 0.5 part of castor wax and 0.15 part of a microcapsule containing 0.08 part of ethylamine salt of hydrochloric acid, which was prepared by covering ethylamine salt of hydrochloric acid with polycarbonate having a softening point of 132° C. by means of a spraying method were mixed together, thereto were added 8 parts of a microcapsule containing 0.2 part of an inorganic ion-exchanger "IXE-600", which was prepared by covering an inorganic ion-exchanger "IXE-600" with the same cuteeric solder particles having a melting point of 183° C. as used in Example 7 by means of a vacuum evaporation method and 82 parts of the above-mentioned cuteeric solder particles having a melting point of 183° C., and they were kneaded in the same manner as in Example 7 to give a solder composition.

The content of halogen was 0.024% by weight and the amount of the inorganic ion-exchanger was 8.2 g.

By using the obtained solder composition, the spread test was carried out and spread percentage was measured in the same manner as in Example 11.

As a result, in any cases, spread percentage was not less than 95% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 21

After 5.5 parts of disproportionated rosin, 4.0 parts of 1,6-hexanediol (special grade chemical), 10 parts of the microcapsule containing 0.04 part of ethylamine salt of hydrochloric acid, which was prepared by covering ethylamine salt of hydrochloric acid with solder particles having a low melting point (bismuth-lead alloy, Bi:Pb (weight ratio)=56.5:43.5, particle diameter: 20 to 40 μm, melting point: 125° C.) by means of a vacuum evaporation method, 0.03 part of ethylamine salt of hydrobromic acid and 0.5 part of castor wax were mixed together, thereto were added 0.2 part of an inorganic ion-exchanger "IXE-500" and 80 parts of the same eutectic solder particles having a melting point of 183° C. as used in Example 7, and they were kneaded in the same manner as in Example 7 to give a solder composition.

The content of halogen was 0.012% by weight and the amount of the inorganic ion-exchanger was 16.5 g.

By using the obtained solder composition, the spread test was carried out and spread percentage was measured in the same manner as in Example 11.

As a result, in any cases, spread percentage was not less than 90% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 22

After 5.5 parts of disproportionated rosin, 4.0 parts of 1,6-hexanediol (special grade chemical), 7 parts of a microcapsule containing 0.08 part of ethylamine salt of hydrochloric acid, which was prepared by covering ethylamine salt of hydrochloric acid with the same solder particles having a melting point of 125° C. as used in Example 21 by means of a vacuum evaporation method and 0.5 part of castor wax were mixed together, thereto were added 0.25 part of a microcapsule prepared by covering an inorganic ion-exchanger "IXE-600" with polycarbonate having a softening point of 132° C. by means of a spraying method and 83 parts of the same eutectic solder particles having a melting point of 183° C. as used in Example 7, and they were kneaded in the same manner as in Example 7 to give a solder composition.

The content of halogen was 0.024% by weight and the amount of the inorganic ion-exchanger was 10.3 g.

By using the obtained solder composition, the spread test was carried out and spread percentage was measured in the same manner as in Example 11.

As a result, in any cases, spread percentage was not less than 89% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 23

After 5.5 parts of disproportionated rosin, 4.0 parts of 1,6-hexanediol (special grade chemical), 7 parts of a microcapsule containing 0.08 part of ethylamine salt of hydrochloric acid, which was prepared by covering ethylamine salt of hydrochloric acid with the same solder particles having a melting point of 125° C. as used in Example 21 by means of a vacuum evaporation method and 0.5 part of castor wax were mixed together, thereto were added 0.25 part of a microcapsule prepared by covering an inorganic ion-exchanger "IXE-600" with polysulfone having a softening point of 188° C. by means of a drying method in liquid and 83 parts of the same eutectic solder particles having a melting point of 183° C. as used in Example 7, and they were kneaded in the same manner as in Example 7 to give a solder composition.

The content of halogen was 0.024% by weight and the amount of the inorganic ion-exchanger was 10.3 g.

By using the obtained solder composition, the spread test was carried out and spread percentage was measured in the same manner as in Example 11.

As a result, in any cases, spread percentage was not less than 95% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

EXAMPLE 24

After 5.5 parts of disproportionated rosin, 4.0 parts of 1,6-hexanediol (special grade chemical), 7 parts of a microcapsule containing 0.08 part of ethylamine salt of hydrochloric acid, which was prepared by covering ethylamine salt of hydrochloric acid with the same solder particles having a melting point of 125° C. as used in Example 21 by means of a vacuum evaporation method and 0.5 part of castor wax were mixed together, thereto were added 8 parts of the microcapsule containing 0.2 part of an inorganic "IXE-600", which was prepared by covering an inorganic ion-exchanger "IXE-600" with the same eutectic solder particles having a melting point of 183° C. as used in Example 7 by means of a vacuum evaporation method and 75 parts of the above-mentioned eutectic solder particles having a melting point of 183° C., and they were kneaded in the same manner as in Example 7 to give a solder composition.

The content of halogen was 0.024% by weight and the amount of the inorganic ion-exchanger was 8.2 g.

By using the obtained solder composition, the spread test was carried out and spread percentage was measured in the same manner as in Example 11.

As a result, in any cases, spread percentage was not less than 95% irrespective of the storage period of the solder composition.

Furthermore, by using the obtained solder composition, a sample was produced, and the ion-migration test of the obtained sample was carried out and insulation degradation time was measured in the same manner as in Example 11.

As a result, in any cases, insulation degradation time was not less than 2000 hours irrespective of the storage period of the solder composition.

As is clear from the results of Examples 10 to 24, when the fluxes for soldering obtained in Examples 10, 12, 14 and 16, and the solder compositions obtained in Examples 11, 13, 15 and 17 to 24 are used, insulation degradation time becomes long. Therefore, it can be understood that these fluxes for soldering and soldering compositions exhibit excellent metal ion-migration resistance.

Moreover, as is clear from the results of the above Examples, when the fluxes for soldering obtained in Examples 10, 12, 14 and 16 are used, zero-cross time becomes short irrespective of the storage period of the flux for soldering. Therefore, it can be understood that these fluxes for soldering exhibit excellent storage stability and soldering property. Also, when the flux for soldering obtained in Example 16 is used, zero-cross time becomes shorter in comparison with the zero-cross time when the flux for soldering obtained in Example 14 is used. Therefore, it can be understood that when the softening point of the resin with which the inorganic ion-exchanger is covered is higher than the softening point of the resin with which the activator containing a halogen atom is covered, soldering property of the obtained flux for soldering becomes great.

Furthermore, as is clear from the results of the above Examples, when the solder compositions obtained in Examples 11, 13, 15 and 17 to 24 are used, spread percentage becomes high irrespective of the storage period of the solder composition. Therefore, it can be understood that these compositions exhibit excellent storage stability and excellent soldering property.

Also, it can be understood that when only the inorganic ion-exchanger is covered with the solder particles as in Example 18 and the softening point of the resin or the melting point of the solder particles with which the inorganic ion-exchanger is covered is higher than the softening point of the resin or the melting point of the solder particles with which the activator containing a halogen atom is covered as in Examples 17, 20, 23 and 24, soldering property of the obtained solder composition becomes great.

EXAMPLE 25

A substrate for ion-migration test having a shape shown in FIG. 1 was coated with the flux obtained in Comparative Example 1 by means of a foam fluxer so that the substrate was coated with the flux in an amount of 0.2 g/cm$^2$. After that, the substrate was coated with an ethyl alcohol solution, in which 3% by weight of an inorganic ion-exchanger "IXE-600" was dispersed, by air spray so that the amount of the ethyl alcohol solution coated was 0.2 g/cm$^2$, the substrate was dipped in a molten solder which is composed of eutectic solder particles (tin-lead alloy, Sn:Pb (weight ratio)=63:37) in a solder bath at 240° C. for 10 seconds so that the amount of the molten solder coated was 0.2 g/cm$^2$, and a soldered comb-type pattern electrode was formed.

The ion-migration test was carried out and insulation degradation time was measured in the same manner as in Example 1 except that the substrate after soldering was used instead of the sample used in Example 1.

As a result, insulation degradation time was not less than 2000 hours. As is clear from this result, the substrate obtained by the above-mentioned soldering method is excellent in metal ion-migration resistance.

EXAMPLE 26

To RA type creamy solder which is composed of eutectic solder particles (tin-lead alloy, Sn:Pb (weight ratio)=63:37), a flux, a solvent and a rosin, was added 0.7% by weight of an inorganic ion-exchanger "IXE-700" based on the total amount of the RA type creamy solder, and they were thoroughly mixed together to give a mixture. A substrate for ion-migration test having a shape as shown in FIG. 1 was coated with the obtained mixture through a mask made of stainless steel having a thickness of 100 μm and a shape corresponding to the comb pattern of the substrate as shown in FIG. 1 by a screen printer for solder paste so that the amount of the mixture coated was 0.2 g/cm$^2$. After that, the coated substrate was heated at 240° C. for 1 minute in a hot-air (reflow) furnace. The inorganic ion-exchanger "IXE-700" was mixed with the creamy solder 2 hours before the time when the above-mentioned coated substrate was heated.

The ion-migration test was carried out and insulation degradation time was measured in the same manner as in Example 1 except that the substrate after soldering (after reflow treatment) was used instead of the sample used in Example 1.

As a result, insulation degradation time was not less than 2000 hours. As is clear from this result, the substrate obtained by the above-mentioned soldering method is excellent in metal ion-migration resistance.

The flux for soldering and the soldering composition of the present invention exhibit excellent soldering property because a layer of oxide can be removed by the activator, and also show excellent metal ion-migration resistance because the inorganic ion-exchanger captures ions remained after soldering.

Also, the activator having a halogen content higher than conventional flux and creamy solder or a sufficient amount of a halogen can be used in the flux for soldering and the solder composition of the present invention. Therefore, the flux for soldering and the soldering composition are extremely excellent in soldering property and contribute to the improvement of productivity during the production of a practical substrate. Furthermore, they can reduce the residual amount of the resin, and are excellent in economy since they do not necessitate conventional inert gas atmosphere such as nitrogen gas.

Furthermore, when the activator or the inorganic ion-exchanger, which is covered with a resin or solder particles is used, the activator is separated from the inorganic ion-exchanger in the flux and the solder composition before the flux and the solder composition are heated and there is little possibility that the activator is captured by the inorganic ion-exchanger. Therefore, the flux for soldering and the solder composition of the present invention can be stored for a long period of time.

In the flux for soldering and the solder composition of the present invention, in which the activator or the inorganic ion-exchanger which is covered with the resin or the solder particles, the removal of the layer of oxide based upon the activator can be controlled by adjusting the softening point or compatible temperature of the resin or the melting point of the the solder particles with which the inorganic ion-exchanger is covered to a temperature which is different from the softening point or compatible temperature of the resin or the melting point of the solder particles with which the activator is covered.

When the softening point or compatible temperature of the resin or the melting point of the solder particles with which the inorganic ion-exchanger is covered is higher than the softening point or compatible temperature of the resin or the melting point of the solder particles with which the activator is covered, because the removal of the layer of oxide based upon the activator proceeds enough before the inorganic ion-exchanger captures ions, the flux for soldering and the solder composition of the present invention exhibit more excellent soldering property.

According to the Soldering method (I) of the present invention in which the solder composition of the present invention is used, soldering property becomes excellent and a substrate obtained by the Soldering method (I) is excellent in metal ion-migration resistance, so that high productivity can be realized.

According to the Soldering method (II) of the present invention when the flux and the inorganic ion-exchanger are to separately applied the portion for soldering, and the solder is applied to the portion for soldering, soldering property becomes excellent and ion-migration after soldering can be sufficiently prevented, so that high productivity can be realized.

According to the Soldering method (III) of the present invention, when a mixture prepared by mixing the inorganic ion-exchanger with the creamy solder containing the activator and the like is coated on a circuit pattern of a wiring plate and the wiring plate is heated, soldering property becomes excellent and ion-migration after soldering can be sufficiently prevented, so that high productivity can be realized.

As mentioned above, the flux for soldering and the solder composition of the present invention can be preferably used without cleaning, and the soldering method of the present invention can be preferably used in practical no-clean soldering methods.

In addition to the ingredients used in the Examples, other ingredients can be used in the Examples as set forth in the specification to obtain substantially the same results.

What is claimed is:

1. A flux for soldering comprising an inorganic ion-exchanger capable of capturing and fixing an ionic impurity which promotes ionization and an activator containing a halogen atom.

2. The flux for soldering of claim 1, wherein said inorganic ion-exchanger is covered with a resin which does not dissolve in a solvent for the flux at normal temperature but is compatible with the solvent for the flux when the resin and the solvent for the flux are mixed together and heated, or covered with a resin which shows plasticity when the resin is heated.

3. The flux for soldering of claim 1, wherein said activator is covered with a resin which does not dissolve in a solvent for the flux at normal temperature but is compatible with the solvent for the flux when the resin and the solvent for the flux are mixed together and heated, or covered with a resin which shows plasticity when the resin is heated.

4. The flux for soldering of claim 1, wherein both said inorganic ion-exchanger and said activator are covered with a resin which does not dissolve in a solvent for the flux at normal temperature but is compatible with the solvent for the flux when the resin and the solvent for the flux are mixed together and heated, or covered with a resin which shows plasticity when the resin is heated, and the softening point or compatible temperature of the resin with which the inorganic ion-exchanger is covered is different from the softening point or compatible temperature of the resin with which the activator is covered.

5. The flux for soldering of claim 4, wherein the softening point or compatible temperature of said resin with which said inorganic ion-exchanger is covered is higher than the softening point or compatible temperature of said resin with which said activator is covered.

6. The flux for soldering of claim 1, wherein said activator is an amine salt of a hydrohalogenic acid.

7. The flux for soldering of claim 1, wherein the content of halogen in said activator is 0.008 to 10% by weight based on the total amount of the flux for soldering, and the amount of said inorganic ion-exchanger is 0.3 to 50 g per 1 g of the halogen of the activator.

8. A solder composition comprising solder particles and a flux for soldering comprising an inorganic ion-exchanger capable of capturing and fixing an ionic impurity which promotes ionization and an activator containing a halogen atom.

9. The solder composition of claim 8, wherein said inorganic ion-exchanger is covered with the solder particles.

10. The solder composition of claim 8, wherein said activator is covered with the solder particles.

11. The solder composition of claim 8, wherein said inorganic ion-exchanger is covered with the solder particles and said activator is covered with at resin which does not dissolve in a solvent for the flux at normal temperature but is compatible with the solvent for the flux when the resin and the solvent for the flux are mixed together and heated, or covered with a resin which shows plasticity when the resin is heated, and the melting point of the solder particles is different from the softening point or compatible temperature of the resin.

12. The solder composition of claim 11, wherein the melting point of the solder particles with which said inorganic ion-exchanger is covered is higher than the softening point or compatible temperature of the resin with which said activator is covered.

13. The solder composition of claim 8, wherein said activator is covered with the solder particles and said inorganic ion-exchanger is covered with a resin which does not dissolve in a solvent for the flux at normal temperature but is compatible with the solvent for the flux when the resin and the solvent for the flux are mixed together and heated, or covered with a resin which shows plasticity when the resin is heated, and the melting point of the solder particles is different from the softening point or compatible temperature of the resin.

14. The solder composition of claim 13, wherein the softening point or compatible temperature of the resin with which said inorganic ion-exchanger is covered is higher than the melting point of the solder particles with which said activator is covered.

15. The solder composition of claim 8, wherein both said inorganic ion-exchanger and said activator are covered with the solder particles.

16. The solder composition of claim 15, wherein the melting point of the solder particles with which said inorganic ion-exchanger is covered is higher than the melting point of the solder particles with which said activator is covered.

17. A soldering method which comprises a step of coating a solder composition comprising solder particles and a flux for soldering comprising an inorganic ion-exchanger capable of capturing and fixing an ionic impurity which promotes ionization and an activator containing a halogen atom on a portion for soldering of a substrate.

18. A soldering method which comprises a step of coating a flux containing an activator on a portion for soldering, a step of applying an inorganic ion-exchanger capable of capturing and fixing an ionic impurity which promotes ionization to the portion for soldering and a step of applying a solder to the portion for soldering.

19. A soldering method which comprises a step of mixing an inorganic ion-exchanger capable of capturing and fixing an ionic impurity which promotes ionization with a creamy solder to give a mixture, a step of coating the mixture on a circuit pattern of a wiring plate and a step of heating the wiring plate.

* * * * *